United States Patent
Zha et al.

(10) Patent No.: US 10,782,335 B2
(45) Date of Patent: Sep. 22, 2020

(54) BACKLIGHT TEST CIRCUIT, BACKLIGHT TEST METHOD AND BACKLIGHT MODULE USING THE SAME

(71) Applicant: Wuhan China Star Optoelectronics Technology Co., Ltd., Wuhan, Hubei (CN)

(72) Inventors: Guowei Zha, Guangdong (CN); Hongqing Cui, Guangdong (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 307 days.

(21) Appl. No.: 15/951,793

(22) Filed: Apr. 12, 2018

(65) Prior Publication Data

US 2019/0137562 A1 May 9, 2019

Related U.S. Application Data

(63) Continuation of application No. PCT/CN2018/071885, filed on Jan. 9, 2018.

(30) Foreign Application Priority Data

Nov. 6, 2017 (CN) .......................... 2017 1 1078595

(51) Int. Cl.
*G01R 31/26* (2020.01)
*H01L 27/12* (2006.01)
(Continued)

(52) U.S. Cl.
CPC ......... *G01R 31/2635* (2013.01); *G01R 31/44* (2013.01); *G09G 3/006* (2013.01);
(Continued)

(58) Field of Classification Search
None
See application file for complete search history.

(56) References Cited

U.S. PATENT DOCUMENTS

2004/0108821 A1* 6/2004 Tang .................... H05B 47/155
315/291
2008/0106505 A1* 5/2008 Chou ..................... H05B 45/37
345/83

(Continued)

FOREIGN PATENT DOCUMENTS

CN 101620818 A 1/2010
CN 101990715 A 3/2011
(Continued)

*Primary Examiner* — Jas A Sanghera
(74) *Attorney, Agent, or Firm* — Hemisphere Law, PLLC; Zhigang Ma

(57) ABSTRACT

Disclosed is a backlight test circuit including N circuit blocks. Each circuit block includes M mini-LED circuits, and each mini-LED circuit includes L mini-LEDs and a switching circuit. The L mini-LEDs are connected in parallel or in serial as a mini-LED set. The switching circuit controls the turning on and the turning off of the mini-LED set according to a control signal. N, M and L are positive integers. During a backlight test, in each circuit block, at least one of the mini-LED sets is turned on. By using this backlight test circuit, the abnormal mini-LED circuit can be found. Thus, a producer can only execute a rework process for the abnormal mini-LED circuit without extra cost.

5 Claims, 5 Drawing Sheets

(51) Int. Cl.
  *G01R 31/44* (2020.01)
  *G09G 3/00* (2006.01)
  *H05B 45/00* (2020.01)
  *H05B 45/20* (2020.01)
  *H05B 45/58* (2020.01)
  *H05B 47/21* (2020.01)
  *H05B 47/23* (2020.01)

(52) U.S. Cl.
  CPC ......... *H01L 27/1214* (2013.01); *H05B 45/00* (2020.01); *H05B 45/20* (2020.01); *H05B 45/58* (2020.01); *H05B 47/21* (2020.01); *H05B 47/23* (2020.01)

(56) References Cited

U.S. PATENT DOCUMENTS

| | | | |
|---|---|---|---|
| 2013/0169190 A1 | 7/2013 | Fujita |
| 2016/0381748 A1 | 12/2016 | Hagino |

FOREIGN PATENT DOCUMENTS

| | | | |
|---|---|---|---|
| CN | 103247269 A | 8/2013 |
| CN | 103280203 A | 9/2013 |
| CN | 104950239 A | 9/2015 |
| CN | 106205504 A | 12/2016 |
| CN | 106847145 A | 6/2017 |
| CN | 107274818 A | 10/2017 |

\* cited by examiner

BACKLIGHT TEST CIRCUIT, BACKLIGHT TEST METHOD AND BACKLIGHT MODULE USING THE SAME

RELATED APPLICATIONS

This application is a continuation application of PCT Patent Application No. PCT/CN2018/071885, filed on Jan. 9, 2018, which claims the priority benefit of Chinese Patent Application No. 201711078595.2, filed on Nov. 6, 2017, which is herein incorporated by reference in its entirety.

FIELD OF THE DISCLOSURE

The disclosure relates to the display technology field, and more particularly to a backlight test circuit, a backlight test method and a backlight module using the same.

BACKGROUND

Currently, the liquid crystal display (LCD) and the organic light emitting diode (OLED) are the main stream of the display technology. The LCD technology is characterized at costs and the reliability, and the OLED is characterized at the high contrast ratio and the wide color gamut. To compensate the contrast ratio of the LCD, the dynamic driving method for backlight division is often used.

Usually, there are many mini-LEDs in one backlight division. During a test process, when there is an abnormal mini-LED in one backlight division, all mini-LEDs in that backlight division will be abandoned, which increases the manufacturing cost.

SUMMARY

The present disclosure provides a backlight test circuit and its relevant products. The backlight test circuit and its relevant products can find abnormal mini-LED set and execute a rework process for it so as to reduce the manufacturing cost.

The backlight test circuit provided by the present disclosure includes N circuit blocks. Each circuit block includes M mini-LED circuits, and each mini-LED circuit includes L mini-LEDs and a switching circuit. The L mini-LEDs are connected in parallel or in serial as a mini-LED set. The switching circuit controls the turning on and the turning off of the mini-LED set according to a control signal. N, M and L are positive integers. It should be noted that, during a backlight test, in each circuit block, at least one of the mini-LED sets is turned on.

In one embodiment of the backlight test circuit provided by the present disclosure, when N for the mini-LED circuits of any one circuit block, control signal input ends of the switching circuits are not connected with each other. However, for any one mini-LED circuit of any one circuit block, the control signal input end of the switching circuit is connected to the control signal input end of the switching circuit of any one mini-LED circuit of another circuit block.

In one embodiment of the backlight test circuit provided by the present disclosure, the switching circuit is a depletion mode TFT. The source of the depletion mode TFT is connected to a voltage source, the gate of the depletion mode TFT receives the control signal, and the drain of the depletion mode TFT is connected to an input end of the mini-LED set. In addition, an output end of the mini-LED circuit is grounded.

The present disclosure also provides a backlight test method that can be adapted to the backlight test circuit in the above embodiments. The backlight test method includes: providing a voltage source signal to each circuit block; providing a control signal to switching circuits of each circuit block; within each time segment, setting only one voltage source signal at a high level, and turning on the switching circuit of only one mini-LED circuit of the circuit block having the voltage source signal at a high level; detecting an output voltage and an output current of the backlight test circuit; and calculating an output impedance according to the output voltage and the output current of the backlight test circuit, wherein the mini-LED circuit is determined to be abnormal when the output impedance is beyond a predetermined impedance range.

In addition, the present disclosure provides a backlight module. The backlight module includes a backlight test circuit. The backlight test circuit includes N circuit blocks. Each circuit block includes M mini-LED circuits, and each mini-LED circuit includes L mini-LEDs and a switching circuit. The L mini-LEDs are connected in parallel or in serial as a mini-LED set. The switching circuit controls the turning on and the turning off of the mini-LED set according to a control signal. N, M and L are positive integers. It should be noted that, during a backlight test, in each circuit block, at least one of the mini-LED sets is turned on.

In one embodiment of the backlight module provided by the present disclosure, when N≥2 for the mini-LED circuits of any one circuit block, control signal input ends of the switching circuits are not connected with each other. However, for any one mini-LED circuit of any one circuit block, the control signal input end of the switching circuit is connected to the control signal input end of the switching circuit of any one mini-LED circuit of another circuit block.

In one embodiment of the backlight module provided by the present disclosure, the switching circuit is a depletion mode TFT. The source of the depletion mode TFT is connected to a voltage source, the gate of the depletion mode TFT receives the control signal, and the drain of the depletion mode TFT is connected to an input end of the mini-LED set. In addition, an output end of the mini-LED circuit is grounded.

The present disclosure also provides a backlight test method that can be executed by the backlight module in the above embodiments. The backlight module in the above embodiment executes the backlight test method to: provide a voltage source signal to each circuit block; provide a control signal to switching circuits of each circuit block; within each time segment, set only one voltage source signal at a high level, and turn on the switching circuit of only one mini-LED circuit of the circuit block having the voltage source signal at a high level; detect an output voltage and an output current of the backlight test circuit; and calculate an output impedance according to the output voltage and the output current of the backlight test circuit, wherein the mini-LED circuit is determined to be abnormal when the output impedance is beyond a predetermined impedance range.

Moreover, the present disclosure provides a display and an electronic device. The display includes the backlight module in the above embodiments, and the electronic device includes the display.

The present disclosure has advantages as follows.

In the present disclosure, the backlight test circuit is divided into circuit blocks. In each circuit block, one mini-LED circuit (having mini-LEDs connected in parallel or in serial) is turned on at a time, and then an output current of the backlight circuit is detected. If there is an abnormal mini-LED in any mini-LED set, it can be found according to the output current of the backlight circuit. Instead of the whole circuit, only one mini-LED set block needs a rework process, and thus the manufacturing cost can be reduced.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure; a person skilled in the art can obtain other drawings according to these drawings without creative efforts. In the figures.

DETAILED DESCRIPTION OF PREFERRED EMBODIMENTS

Figure 1A:
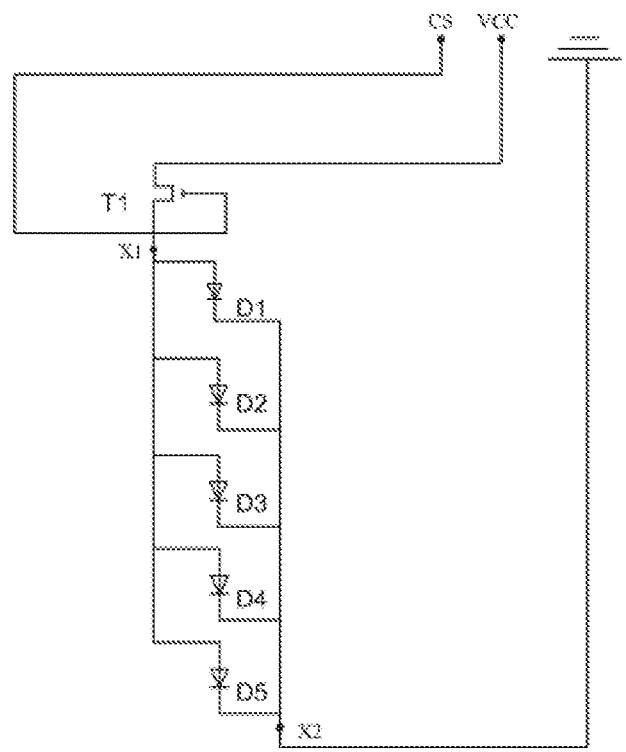
FIG. 1A is a circuit diagram of a mini-LED circuit in a circuit block of a backlight test circuit according to an embodiment of the disclosure.

The technical solutions in the embodiments of the disclosure will be described clearly and completely hereinafter with reference to the accompanying drawings in the embodiments of the disclosure so that those skilled in the art may better understand the solutions of the disclosure. Evidently, the described embodiments are merely some embodiments rather than all embodiments of the disclosure. All other embodiments obtained by persons of ordinary skill in the art based on the embodiments of the disclosure without creative efforts shall belong to the protection scope of the disclosure.

It needs to be noted that the terms "first", "second" and so on in the specification, the claims and the accompanying drawings of the disclosure are used for distinguishing similar objects, but are not necessarily used for describing a specific sequence or a precedence order. It should be understood that data used in this way are interchangeable in an appropriate condition, so that the embodiments described herein of the disclosure can be implemented in a sequence besides those illustrated or described herein.

Specific features, structures, or characteristics can be included in at least one implementation of the present disclosure. Each implementation described herein can be combined with other implementations without confliction.

The embodiments provided by the present disclosure are illustrated in the following descriptions with corresponding figures.

The backlight test circuit in this embodiment is divided into N circuit blocks. Each circuit block includes M mini-LED circuits. Each mini-LED circuit includes L mini-LEDs and a switching circuit. The L mini-LEDs are connected in parallel or in serial as a mini-LED set. The mini-LED set (including L mini-LEDs connected in parallel or in serial) is connected to the switching circuit to receive a driving current. For one switch circuit of any mini-LED circuit, its source is connected to a voltage source, its gate receives a control signal, and its drain is connected to an input end of the mini-LED set. In addition, an output end of the mini-LED circuit is grounded, and N, M and L are positive integers.

The sources of the switch circuits in the same circuit block are connected to an input end of the same voltage source, and sources of the switch circuits in two different circuit blocks are respectively connected to input ends of two different voltage sources. When N≥2, for the mini-LED circuits of any one circuit block, control signal input ends of the switching circuits are not connected with each other. However, for any one mini-LED circuit of any one circuit block, the control signal input end of the switching circuit is connected to the control signal input end of the switching circuit of any one mini-LED circuit of another circuit block, and they are connected to an input end of the same control signal source CS.

For example, the sources of all switching circuits in the first circuit block, the sources of all switching circuits in the second circuit block, and the sources of all switching circuits in the third circuit block are respectively connected different input ends of the voltage source. The gate of the switching circuit of the first mini-LED circuit in the first circuit block can be connected the gate of the switching circuit of any mini-LED circuit in the second circuit block and to the gate of the switching circuit of any mini-LED circuit in the $N^{th}$ circuit block. The gate of the switching circuit of the second mini-LED circuit in the first circuit block can be connected the gate of the switching circuit of any mini-LED circuit in the second circuit block and to the gate of the switching circuit of any mini-LED circuit in the $N^{th}$ circuit block.

Referring to FIG. 1A, a circuit diagram of a mini-LED circuit in a circuit block of a backlight test circuit according to an embodiment of the disclosure is shown. In FIG. 1A, N=1, M=1 and L=5, and there are five mini-LEDs and one TFT; however, it is not limited thereto. For ease of illustration, D1, D2, D3, D4 and D5 represent for five mini-LEDs, and T1 represents for the TFT. D1, D2, D3, D4 and D5 are connected in parallel as a mini-LED set. The input end of the mini-LED set (i.e. X1 in FIG. 1A) is connected to the drain of T1, the output end of the mini-LED set (i.e. X2 in FIG. 1A) is grounded, the source of T1 is connected to a voltage source VCC, and the gate of T1 receives a control signal CS.

Figure 1B:
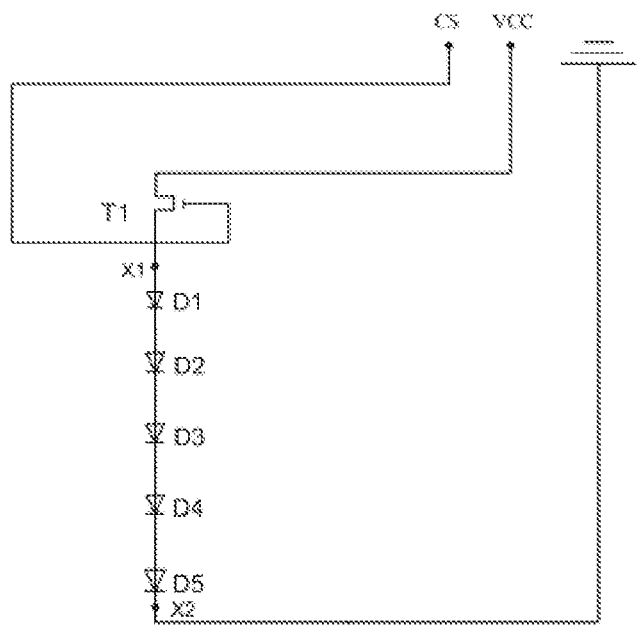
FIG. 1B is a circuit diagram of a mini-LED circuit in a circuit block of a backlight test circuit according to another embodiment of the disclosure.

Referring to FIG. 1B, a circuit diagram of a mini-LED circuit in a circuit block of a backlight test circuit according to another embodiment of the disclosure is shown. In FIG. 1B, N=1, M=1 and L=5, and there are five mini-LEDs and one TFT; however, it is not limited thereto. For ease of illustration, D1, D2, D3, D4 and D5 represent for five mini-LEDs, and T1 represents for the TFT. D1, D2, D3, D4 and D5 are connected in serial as a mini-LED set. The input end of the mini-LED set (i.e. X1 in FIG. 1B) is connected to the drain of T1, the output end of the mini-LED set (i.e. X2 in FIG. 1B) is grounded, the source of T1 is connected to a voltage source VCC, and the gate of T1 receives a control signal CS.

For example, the mini-LEDs in FIG. 1A and FIG. 1B are blue, green and red mini-LEDs. These three color mini-LEDs are arranged sequentially and repeatedly. The color mixing distance of these three color mini-LEDs is less than 1 mm, so that the lights of these three color mini-LEDs can be well mixed and the white backlight can be generated as required by a display.

When the control signal received by the TFT is positive, the TFT is turned on, but when the control signal received by the TFT is negative, the TFT is turned off.

Figure 2:
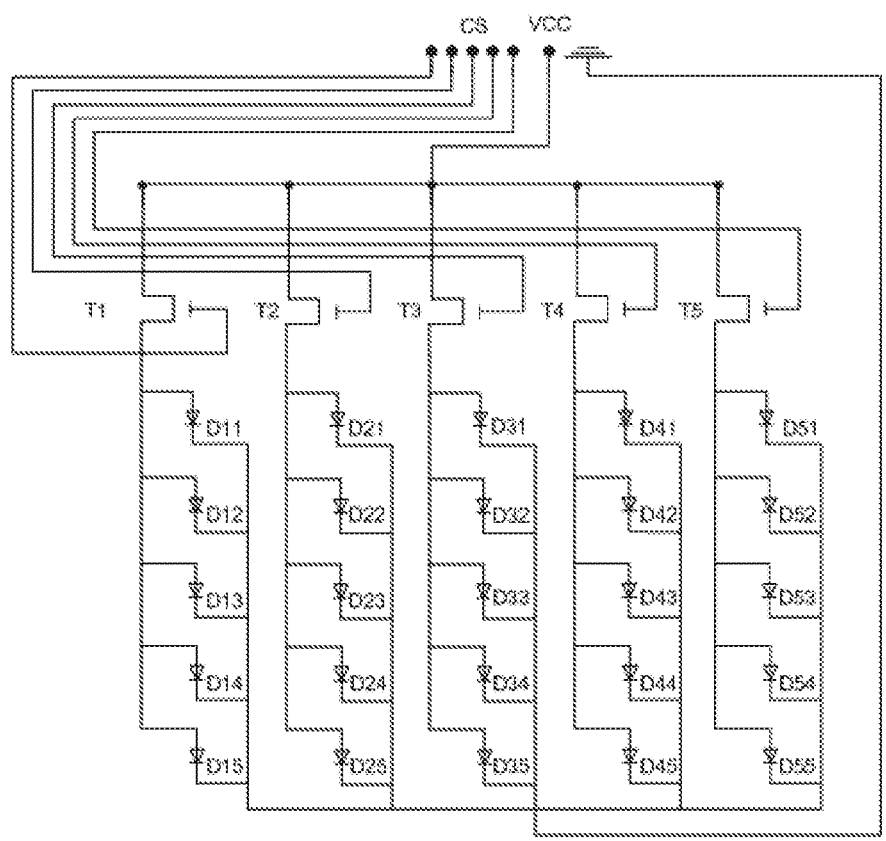
FIG. 2 is a circuit diagram of a circuit block of a backlight test circuit according to an embodiment of the disclosure.
Figure 5:
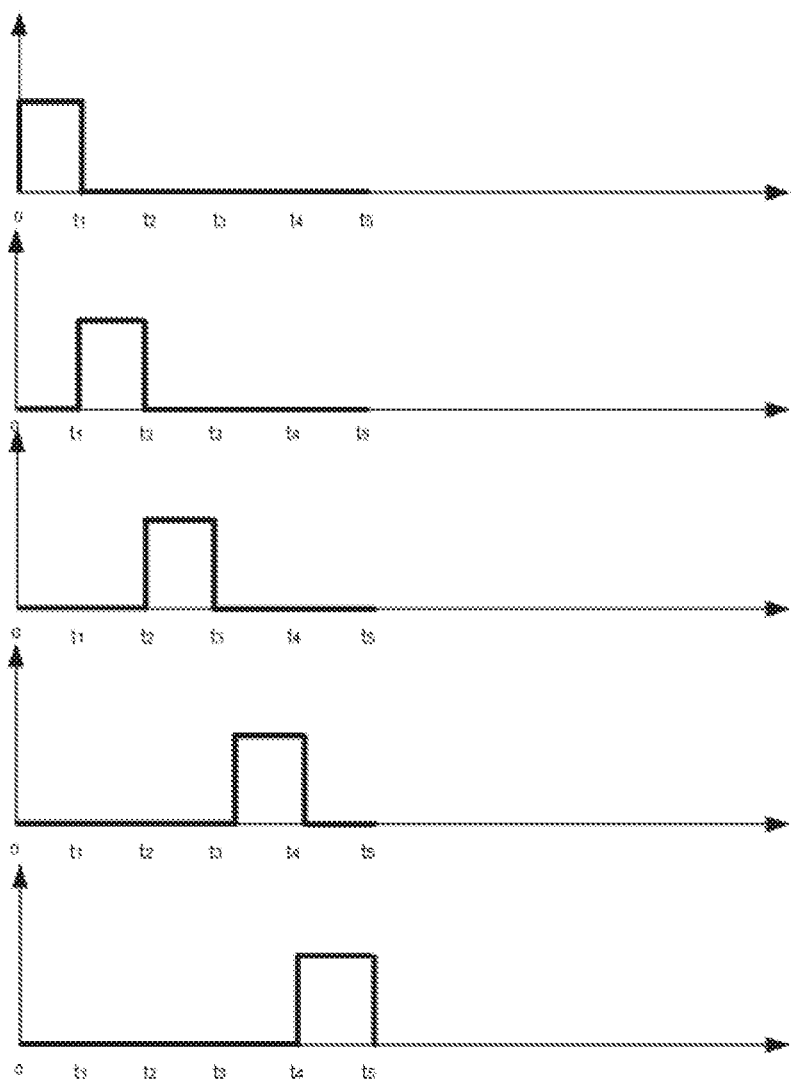
FIG. 5 is a waveform diagram of a control signal according to an embodiment of the disclosure.

Referring to FIG. 2, a circuit diagram of a circuit block of a backlight test circuit according to an embodiment of the disclosure is shown. In FIG. 2, N=1, M=5 and L=5. The circuit shown in FIG. 2 includes five circuits shown in FIG. 1A. In FIG. 2, there are five mini-LED circuits but it is not limited thereto. The circuit in FIG. 2 includes five TFTs (i.e. five mini-LED circuits), and each of the five mini-LED circuits can be the circuit shown in FIG. 1A or FIG. 1B. FIG. 1A is used in the circuit in FIG. 2 for ease of illustration. The first mini-LED circuit includes a mini-LED set including D11, D12, D13, D14 and D15, the input end of the mini-LED set is connected to the drain of T1, and the output end of the mini-LED set is grounded. The gate of T1 receives a control signal CS, and the source of T1 is connected to the input voltage source. The second mini-LED circuit includes a mini-LED set having D21, D22, D23, D24 and D25 connected in parallel, the input end of the mini-LED set is connected to the drain of T2, and the output end of the mini-LED set is grounded. The gate of T2 receives a control signal CS, and the source of T2 is connected to the voltage source VCC. The third mini-LED circuit includes a mini-LED set having D31, D32, D33, D34 and D35 connected in parallel, the input end of the mini-LED set is connected to the drain of T3, and the output end of the mini-LED set is grounded. The gate of T3 receives a control signal CS, and the source of T3 is connected to the voltage source VCC. The fourth mini-LED circuit includes a mini-LED set having D41, D42, D43, D44 and D45 connected in parallel, the input end of the mini-LED set is connected to the drain of T4, and the output end of the mini-LED set is grounded. The gate of T4 receives a control signal CS, and the source of T4 is connected to the voltage source VCC. The fifth mini-LED circuit includes a mini-LED set having D51, D52, D53, D54 and D55 connected in parallel, the input end of the mini-LED set is connected to the drain of T5, and the output end of the mini-LED set is grounded. The gate of T5 receives a control signal CS, and the source of T5 is connected to the voltage source VCC. The waveforms of the control signals received by the gates of T1, T2, T3, T4 and T5 are shown in FIG. 5. It should be noted that, the sources of T1, T2, T3, T4 and T5 are connected to the same voltage source VCC.

Figure 3:
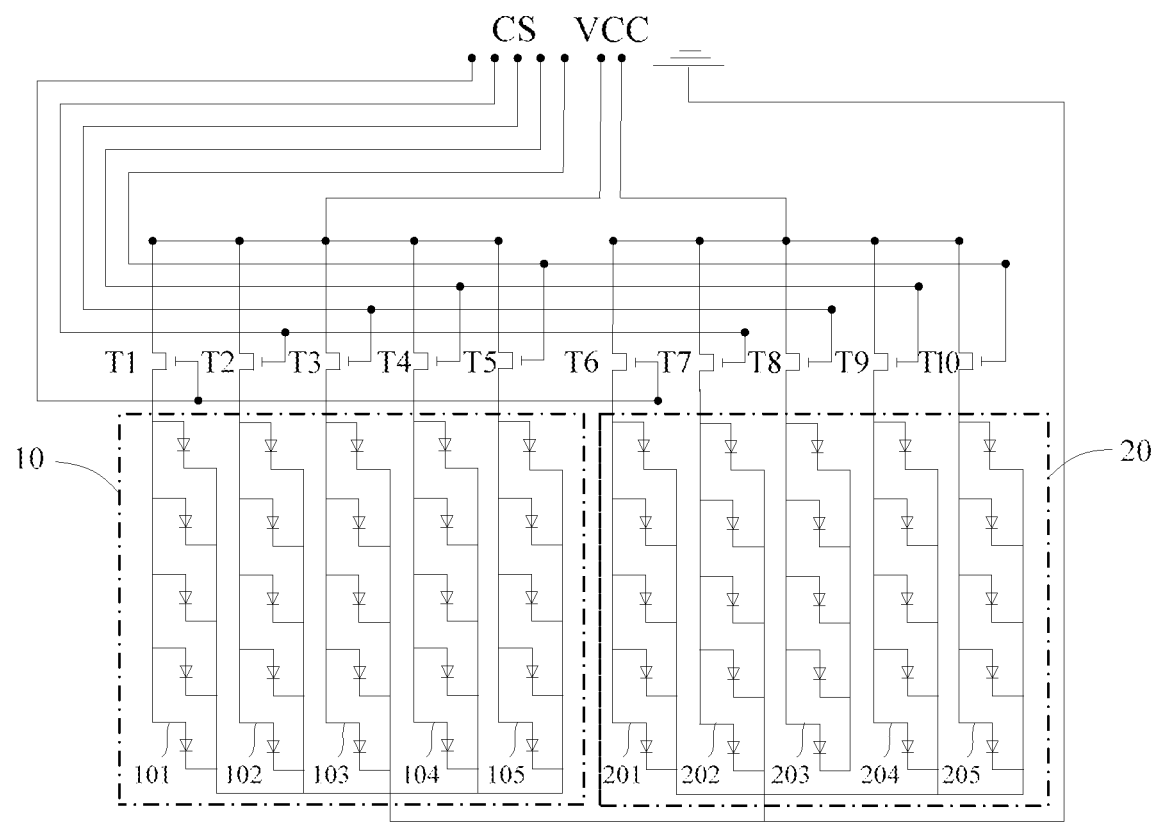
FIG. 3 is a circuit diagram of a backlight test circuit according to an embodiment of the disclosure.

Referring to FIG. 3, a circuit diagram of a backlight test circuit according to an embodiment of the disclosure is shown. In FIG. 3, N=2, M=5 and L=5. The circuit shown in FIG. 3 can be considered a basic circuit structure of the present disclosure. Other embodiments with more complex circuit structures can have the circuit shown in FIG. 3 as a basic circuit, but they are not further described. Compared with the circuits shown in FIG. 1 and FIG. 2, the circuit shown in FIG. 3 is preferred, but the present disclosure is not restricted by the circuit shown in FIG. 3. In FIG. 3, the backlight test circuit includes two circuit blocks and 10 TFTs, and one circuit block includes five mini-LED circuits. For ease of illustration, in the following descriptions, 10 represents for the first circuit block and 20 represents for the second circuit block. In the first circuit block, 101 represents for the mini-LED circuit, 102 represents for the second mini-LED circuit, 103 represents for the third mini-LED circuit, 104 represents for the fourth mini-LED circuit and 105 represents for the fifth mini-LED circuit. In the second circuit block, 201 represents for the mini-LED circuit, 202 represents for the second mini-LED circuit, 203 represents for the third mini-LED circuit, 204 represents for the fourth mini-LED circuit and 205 represents for the fifth mini-LED circuit. In addition, T1, T2, T3, T4, T5, T6, T7, T8, T9 and T10 represent for TFTs.

The circuit configuration of the first circuit block 10 is described as follows. The input end of the first mini-LED circuit 101 is connected to the drain of T1, the gate of T1 receives a control signal CS, and the source of T1 is connected to a voltage source VCC. The input end of the second mini-LED circuit 102 is connected to the drain of T2, the gate of T2 receives a control signal CS, and the source of T2 is connected to a voltage source VCC. The input end of the third mini-LED circuit 103 is connected to the drain of T3, the gate of T3 receives a control signal CS, and the source of T3 is connected to a voltage source VCC. The input end of the fourth mini-LED circuit 104 is connected to the drain of T4, the gate of T4 receives a control signal CS, and the source of T4 is connected to a voltage source VCC. The input end of the fifth mini-LED circuit 105 is connected to the drain of T5, the gate of T5 receives a control signal CS, and the source of T5 is connected to a voltage source VCC. The circuit configuration of the second circuit block 20 is described as follows. The input end of the first mini-LED circuit 201 is connected to the drain of T6, the gate of T6 receives a control signal CS and the source of T6 is connected to a voltage source VCC. The input end of the second mini-LED circuit 202 is connected to the drain of T7, the gate of T7 receives a control signal CS and the source of T7 is connected to a voltage source VCC. The input end of the third mini-LED circuit 203 is connected to the drain of T8, the gate of T8 receives a control signal CS and the source of T8 is connected to a voltage source VCC. The input end of the fourth mini-LED circuit 204 is connected to the drain of T9, the gate of T9 receives a control signal CS and the source of T9 is connected to a voltage source VCC. The input end of the fifth mini-LED circuit 205 is connected to the drain of T10, the gate of T10 receives a control signal CS and the source of T10 is connected to a voltage source VCC. The control signals received by the gates of T1 and T6 are the same, the control signals received by the gates of T2 and T7 are the same, the control signals received by the gates of T3 and T8 are the same, the control signals received by the gates of T4 and T9 are the same, and the control signals received by the gates of T5 and T10 are the same. The sources of T1, T2, T3, T4 and T5 are connected to the same voltage source VCC, and the sources of T6, T7, T8, T9 and T10 are connected to the same voltage source VCC. It should be noted that, the waveforms of the control signals CS are shown in FIG. 5, and the waveforms of the voltage sources are shown in FIG. 4.

Figure 6:
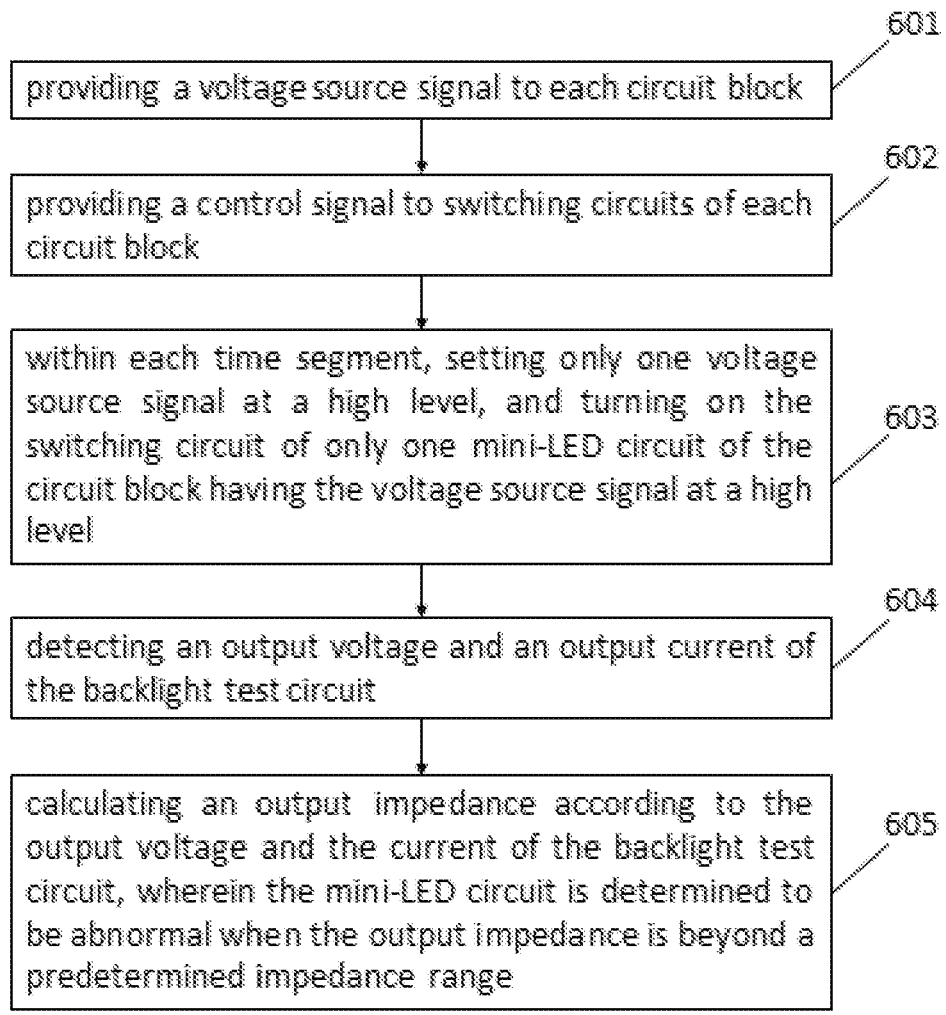
FIG. 6 is a flow chart of a backlight test method according to an embodiment of the disclosure.

FIG. 6 is a flow chart of a backlight test method according to an embodiment of the disclosure. This backlight test method is adapted to the circuit shown in FIG. 3 and includes steps as follows. It should be noted that, the following steps are for illustrating but not for restricting the backlight test method.

Step S601: A voltage source signal VCC is provided to each circuit block.

Figure 4:
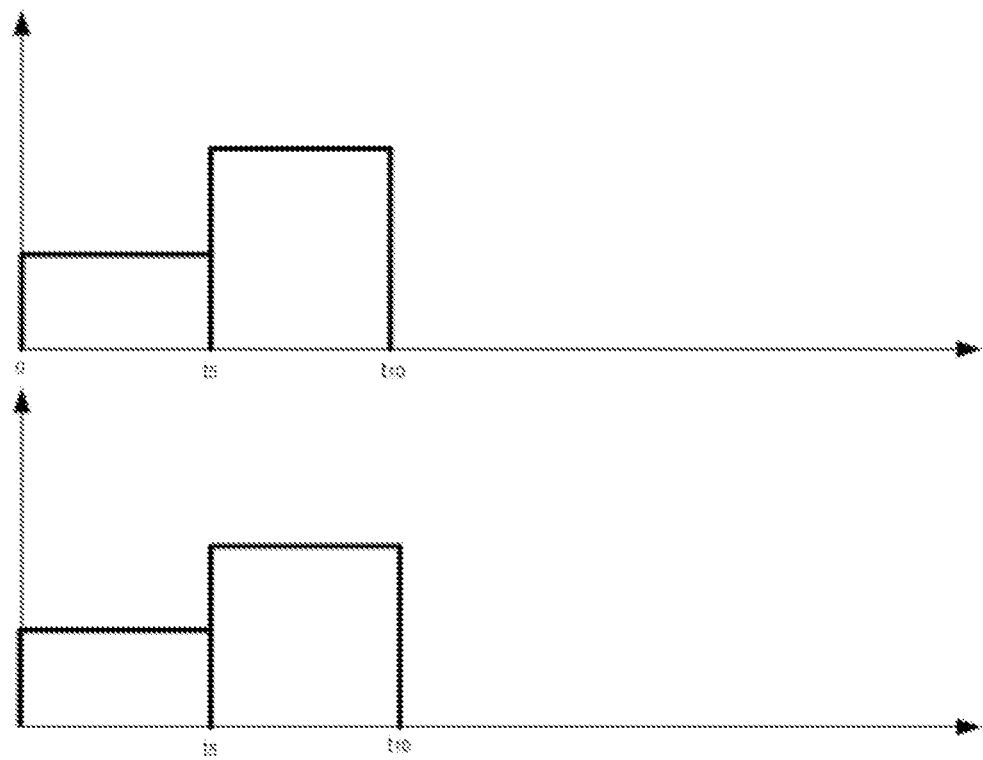
FIG. 4 is a waveform diagram of a voltage source signal according to an embodiment of the disclosure.

As shown in FIG. 4, the time period of the voltage source signal VCC provided to each circuit block is $t_{10}$. At different time period, different voltages are provided to the sources of TFTs of the two circuit blocks. Within $0$~$t_5$, the voltage provided to the sources of TFTs in the first circuit block is at a high level and the voltage value $V_1$=V, and the voltage provided to the sources of TFTs in the second circuit block is at a high level and the voltage value $V_2$=V. If there are N circuit blocks (N>2), the voltage provided to the sources of TFTs in different circuit blocks at different timings should be adjusted, but it is omitted herein.

Different voltages are provided to TFTs in the first circuit block and TFTs in the second circuit block at different timings, so within $0 \sim t_5$, the switching circuit in the second circuit block cannot be turned on by the voltage source signal provided to the second circuit block, and within $t_5 \sim t_{10}$, the switching circuit in the first circuit block cannot be turned on by the voltage source signal provided to the first circuit block.

Step S602: A control signal is provided to switching circuits of each circuit block.

As shown in FIG. 5, the time period of the control signal CS provided to each circuit block is $t_5$. Within $0 \sim t_1$, the control signal provided to the first mini-LED circuit is at a high level, and the control signals provided to the other mini-LED circuits are at a low level. Within $t_1 \sim t_2$, the control signal provided to the second mini-LED circuit is at a high level, and the control signals provided to the other mini-LED circuits are at a low level. Within $t_4 \sim t_5$, the control signal provided to the fifth mini-LED circuit is at a high level, and the control signals provided to the other mini-LED circuits are at a low level.

Step S603: Within each time segment, only one voltage source signal is set at a high level, and the switching circuit of only one mini-LED circuit of the circuit block having the voltage source signal at a high level is turned on.

For example, within $0 \sim t_5$, the voltage value of the voltage source signal provided to the first circuit block is set as |UP|, and the voltage value of the voltage source signal provided to the second circuit block is set as 2|UP|. In addition, the high level of the control signal CS can be set as |UP|.

According to FIG. 4 and FIG. 5, within $0 \sim t_5$, the voltage value of the voltage source signal provided to the first circuit block is |UP|, the control signal provide to the first mini-LED circuit is at a high level within $0 \sim t_1$ (i.e. within $0 \sim t_1$, only the first mini-LED circuit is turned on), the control signal provide to the second mini-LED circuit is at a high level within $t_1 \sim t_2$ (i.e. within $t_1 \sim t_2$, only the second mini-LED circuit is turned on), the control signal provide to the third mini-LED circuit is at a high level within $t_2 \sim t_3$ (i.e. within $t_2 \sim t_3$, only the third mini-LED circuit is turned on), the control signal provide to the fourth mini-LED circuit is at a high level within $t_3 \sim t_4$ (i.e. within $t_3 \sim t_4$, only the fourth mini-LED circuit is turned on), the control signal provide to the fifth mini-LED circuit is at a high level within $t_4 \sim t_5$ (i.e. within $t_4 \sim t_5$, only the fifth mini-LED circuit is turned on). Within $0 \sim t_5$, the voltage value of the voltage source signal provided to the second circuit block is set as 2|UP|, so within $0 \sim t_5$, the five mini-LED circuits in the second circuit block are turned off, and within $t_5 \sim t_{10}$, the five mini-LED circuits in the second circuit block are turned on one by one. The mini-LED circuits in the second circuit block are turned on in the same way as how the mini-LED circuits in the first circuit block are turned on.

Step S604: An output voltage and an output current of the backlight test circuit are detected.

After receiving the voltage source signal VCC and the control signal CS, the backlight test circuit turns on TFTs in each circuit block. After TFTs in one circuit block are turned on, five mini-LED circuits are turned on one by one. When one mini-LED circuit is turned, its output voltage and output current are detected.

Step S605: An output impedance is calculated according to the output voltage and the output current of the backlight test circuit. The mini-LED circuit is determined to be abnormal when the output impedance is beyond a predetermined impedance range.

When one mini-LED circuit in one circuit block is turned, its output voltage and its output current are detected, and the output impedance is calculated according to the output voltage and the output current of the mini-LED circuit.

For example, when the first mini-LED circuit in the first circuit block is turned on, if there at least one mini-LED forming an open circuit or a short circuit, the output impedance of the first mini-LED circuit is calculated according to the detected output voltage and the detected output current of the first mini-LED circuit. When the output impedance of the first mini-LED circuit is beyond a predetermined impedance range, it indicates that there is an abnormal mini-LED in the first mini-LED circuit, and thus all mini-LEDs in the first mini-LED circuit need to be replaced in the rework process.

It should be noted that, in the mini-LED circuit, if the mini-LEDs are connected in serial, the above steps of the backlight test method are still valid.

When mini-LEDs in all circuit blocks are turned on, the voltage shown in FIG. 3 is not provided to the gates and the sources of TFTs in the backlight test circuit. According to different video signals, the backlight test circuit will obtain different input voltages, and the mini-LEDs in the N circuit blocks are accordingly turned on.

In the present disclosure, mini-LEDs are used as direct backlight sources. There are many mini-LEDs in each circuit block. By using mini-LEDs as direct backlight sources, the color mixing distance is smaller, and thus the backlight test circuit can be used for manufacturing small size device. In each circuit block, mini-LEDs are divided in different mini-LED sets, and the switch circuit corresponding to each mini-LED set is a depletion mode TFT for providing a driving current. During a test process, mini-LED circuits are turned on one by one. The mini-LED circuit having an abnormal mini-LED will be fixed by a rework process instead of all mini-LEDs in the whole circuit block. Thus, there will be less mini-LEDs being wasted. In addition, according to different video signals, mini-LEDs in corresponding circuit block are turned on, which can increase the contrast ratio. Moreover, in the same circuit block, the mini-LED circuits are driven by the same current, and thus there will be no additional power loss.

The present disclosure also provides a backlight module. The backlight module includes the circuit as shown in FIG. 2. The circuit shown in FIG. 2 includes five circuits shown in FIG. 1, but it is not limited thereto. The circuit shown in FIG. 2 includes five TFTs, which are T1, T2, T3, T4 and T5, and five mini-LED circuits. Each of the five mini-LED circuits can be the circuit shown in FIG. 1A or FIG. 1B. FIG. 1A is used in the circuit in FIG. 2 for ease of illustration. The first mini-LED circuit includes a mini-LED set including D11, D12, D13, D14 and D15, the input end of the mini-LED set is connected to the drain of T1, and the output end of the mini-LED set is grounded. The gate of T1 receives a control signal CS, and the source of T1 is connected to the input voltage source. The second mini-LED circuit includes a mini-LED set having D21, D22, D23, D24 and D25 connected in parallel, the input end of the mini-LED set is connected to the drain of T2, and the output end of the mini-LED set is grounded. The gate of T2 receives a control signal CS, and the source of T2 is connected to the voltage source VCC. The third mini-LED circuit includes a mini-LED set having D31, D32, D33, D34 and D35 connected in parallel, the input end of the mini-LED set is connected to the drain of T3, and the output end of the mini-LED set is grounded. The gate of T3 receives a control signal CS, and the source of T3 is connected to the voltage source VCC. The fourth mini-LED circuit includes a mini-LED set having D41, D42, D43, D44 and D45 connected in parallel, the input end of the mini-LED set is connected to the drain of T4, and the output end of the mini-LED set is grounded. The gate of T4 receives a control signal CS, and the source of T4 is connected to the voltage source VCC. The fifth mini-LED circuit includes a mini-LED set having D51, D52, D53, D54 and D55 connected in parallel, the input end of the mini-LED set is connected to the drain of T5, and the output end of the mini-LED set is grounded. The gate of T5 receives a control signal CS, and the source of T5 is connected to the voltage source VCC. The waveforms of the control signals CS received by the gates of T1, T2, T3, T4 and T5 are shown in FIG. 5. It should be noted that, the sources of T1, T2, T3, T4 and T5 are connected to the same voltage source VCC.

The backlight module also includes the circuit shown in FIG. 3. In FIG. 3, N=2, X=1, M=5 and L=5. The circuit shown in FIG. 3 can be considered a basic circuit structure of the present disclosure. Other embodiments with more complex circuit structures can have the circuit shown in FIG. 3 as a basic circuit, but they are not further described. Compared with the circuits shown in FIG. 1 and FIG. 2, the circuit shown in FIG. 3 is preferred, but the present disclosure is not restricted by the circuit shown in FIG. 3. In FIG. 3, the backlight test circuit includes two circuit blocks and 10 TFTs, and one circuit block includes five mini-LED circuits. For ease of illustration, in the following descriptions, 10 represents for the first circuit block and 20 represents for the second circuit block. In the first circuit block, 101 represents for the mini-LED circuit, 102 represents for the second mini-LED circuit, 103 represents for the third mini-LED circuit, 104 represents for the fourth mini-LED circuit and 105 represents for the fifth mini-LED circuit. In the second circuit block, 201 represents for the mini-LED circuit, 202 represents for the second mini-LED circuit, 203 represents for the third mini-LED circuit, 204 represents for the fourth mini-LED circuit and 205 represents for the fifth mini-LED circuit. In addition, T1, T2, T3, T4. T5, T6, T7, T8, T9 and T10 represent for TFTs.

The circuit configuration of the first circuit block 10 is described as follows. The input end of the first mini-LED circuit 101 is connected to the drain of T1, the gate of T1 receives a control signal CS, and the source of T1 is connected to a voltage source VCC. The input end of the second mini-LED circuit 102 is connected to the drain of T2, the gate of T2 receives a control signal CS, and the source of T2 is connected to a voltage source VCC. The input end of the third mini-LED circuit 103 is connected to the drain of T3, the gate of T3 receives a control signal CS, and the source of T3 is connected to a voltage source VCC. The input end of the fourth mini-LED circuit 104 is connected to the drain of T4, the gate of T4 receives a control signal CS, and the source of T4 is connected to a voltage source VCC. The input end of the fifth mini-LED circuit 105 is connected to the drain of T5, the gate of T5 receives a control signal CS, and the source of T5 is connected to a voltage source VCC. The circuit configuration of the second circuit block 20 is described as follows. The input end of the first mini-LED circuit 201 is connected to the drain of T6, the gate of T6 receives a control signal CS and the source of T6 is connected to a voltage source VCC. The input end of the second mini-LED circuit 202 is connected to the drain of T7, the gate of T7 receives a control signal CS and the source of T7 is connected to a voltage source VCC. The input end of the third mini-LED circuit 203 is connected to the drain of T8, the gate of T8 receives a control signal CS and the source of T8 is connected to a voltage source VCC. The input end of the fourth mini-LED circuit 204 is connected to the drain of T9, the gate of T9 receives a control signal CS and the source of T9 is connected to a voltage source VCC. The input end of the fifth mini-LED circuit 205 is connected to the drain of T10, the gate of T10 receives a control signal CS and the source of T10 is connected to a voltage source VCC. The control signals received by the gates of T1 and T6 are the same, the control signals received by the gates of T2 and T7 are the same, the control signals received by the gates of T3 and T8 are the same, the control signals received by the gates of T4 and T9 are the same, and the control signals received by the gates of T5 and T10 are the same. The sources of T1, T2, T3, T4 and T5 are connected to the same voltage source VCC, and the sources of T6, T7, T8, T9 and T10 are connected to the same voltage source VCC. It should be noted that, the waveforms of the control signals CS are shown in FIG. 5, and the waveforms of the voltage sources are shown in FIG. 4.

The backlight test method shown in FIG. 6 can also be adapted to the backlight module. The backlight test method includes steps as follows.

Step S601: A voltage source signal VCC is provided to each circuit block.

As shown in FIG. 4, the time period of the voltage source signal VCC provided to each circuit block is $t_{10}$. Different voltages are provided to the sources of TFTs of the two circuit blocks at different timings. Within $0 \sim t_5$, the voltage provided to the sources of TFTs in the first circuit block is at a high level and the voltage value $V_1=V$, and the voltage provided to the sources of TFTs in the second circuit block is at a high level and the voltage value $V_2=V$. If there are N circuit blocks (N>2), the voltage provided to the sources of TFTs in different circuit blocks at different timings should be adjusted, but it is omitted herein.

Different voltages are provided to TFTs in the first circuit block and TFTs in the second circuit block at different timings, so within $0 \sim t_5$, the switching circuit in the second circuit block cannot be turned on by the voltage source signal provided to the second circuit block, and within $t_5 \sim t_{10}$, the switching circuit in the first circuit block cannot be turned on by the voltage source signal provided to the first circuit block.

Step S602: A control signal is provided to switching circuits of each circuit block.

As shown in FIG. 5, the time period of the control signal CS provided to each circuit block is $t_{10}$. Within $0 \sim t_1$, the control signal provided to the first mini-LED circuit is at a high level, and the control signals provided to the other mini-LED circuits are at a low level. Within $t_1 \sim t_2$, the control signal provided to the second mini-LED circuit is at a high level, and the control signals provided to the other mini-LED circuits are at a low level. Within $t_4 \sim t_5$, the control signal provided to the fifth mini-LED circuit is at a high level, and the control signals provided to the other mini-LED circuits are at a low level.

Step S603: Within each time segment, only one voltage source signal is set at a high level, and the switching circuit of only one mini-LED circuit of the circuit block having the voltage source signal at a high level is turned on.

For example, within $0 \sim t_5$, the voltage value of the voltage source signal provided to the first circuit block is set as |UP|, and the voltage value of the voltage source signal provided to the second circuit block is set as 2|UP|. In addition, the high level of the control signal CS can be set as |UP|.

According to FIG. 4 and FIG. 5, within $0\sim t_5$, the voltage value of the voltage source signal provided to the first circuit block is |UP|, the control signal provide to the first mini-LED circuit is at a high level within $0\sim t_1$ (i.e. within $0\sim t_1$, only the first mini-LED circuit is turned on), the control signal provide to the second mini-LED circuit is at a high level within $t_1\sim t_2$ (i.e. within $t_1\sim t_2$, only the second mini-LED circuit is turned on), the control signal provide to the third mini-LED circuit is at a high level within $t_2\sim t_3$ (i.e. within $t_2\sim t_3$, only the third mini-LED circuit is turned on), the control signal provide to the fourth mini-LED circuit is at a high level within $t_3\sim t_4$ (i.e. within $t_3\sim t_4$, only the fourth mini-LED circuit is turned on), the control signal provide to the fifth mini-LED circuit is at a high level within $t_4\sim t_5$ (i.e. within $t_4\sim t_5$, only the fifth mini-LED circuit is turned on). Within $0\sim t_5$, the voltage value of the voltage source signal provided to the second circuit block is set as 2|UP|, so within $0\sim t_5$, the five mini-LED circuits in the second circuit block are turned off, and within $t_5\sim t_{10}$, the five mini-LED circuits in the second circuit block are turned on one by one. The mini-LED circuits in the second circuit block are turned on in the same way as how the mini-LED circuits in the first circuit block are turned on.

Step S604: An output voltage and an output current of the backlight test circuit are detected.

After receiving the voltage source signal VCC and the control signal CS, the backlight test circuit turns on TFTs in each circuit block. After TFTs in one circuit block are turned on, five mini-LED circuits are turned on one by one. When one mini-LED circuit is turned, its output voltage and output current are detected.

Step S605: An output impedance is calculated according to the output voltage and the output current of the backlight test circuit. The mini-LED circuit is determined to be abnormal when the output impedance is beyond a predetermined impedance range.

When one mini-LED circuit in one circuit block is turned, its output voltage and its output current are detected, and the output impedance is calculated according to the output voltage and the output current of the mini-LED circuit.

For example, when the first mini-LED circuit in the first circuit block is turned on, if there at least one mini-LED forming an open circuit or a short circuit, the output impedance of the first mini-LED circuit is calculated according to the detected output voltage and the detected output current of the first mini-LED circuit. When the output impedance of the first mini-LED circuit is beyond a predetermined impedance range, it indicates that there is an abnormal mini-LED in the first mini-LED circuit, and thus all mini-LEDs in the first mini-LED circuit need to be replaced in the rework process.

The present disclosure also provides a display, and the display includes the above backlight module.

The present disclosure also provides an electronic device, and the electronic device includes the above display.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A backlight test method, adapted to a backlight test circuit comprising N circuit blocks, wherein each circuit block includes M mini-LED circuits, each mini-LED circuit includes L mini-LEDs and a switching circuit, the L mini-LEDs are connected in parallel or in serial as a mini-LED set, the switching circuit controls the turning on and the turning off of the mini-LED set according to a control signal, and N, M and L are positive integers, comprising:
   providing a voltage source signal to each circuit block;
   providing a control signal to switching circuits of each circuit block;
   within each time segment, setting only one voltage source signal at a high level, and turning on the switching circuit of only one mini-LED circuit of the circuit block having the voltage source signal at a high level;
   detecting an output voltage and an output current of the backlight test circuit; and
   calculating an output impedance according to the output voltage and the output current of the backlight test circuit, wherein the mini-LED circuit is determined to be abnormal when the output impedance is beyond a predetermined impedance range.

2. A backlight module, comprising:
   a backlight test circuit, including N circuit blocks, wherein each circuit block includes M mini-LED circuits, each mini-LED circuit includes L mini-LEDs and a switching circuit, the L mini-LEDs are connected in parallel or in serial as a mini-LED set, the switching circuit controls the turning on and the turning off of the mini-LED set according to a control signal, and N, M and L are positive integers;
   wherein during a backlight test, in each circuit block, at least one of the mini-LED sets is turned on,
   wherein the backlight module executes a backlight test method comprising:
   provide a voltage source signal to each circuit block;
   provide a control signal to switching circuits of each circuit block;
   within each time segment, set only one voltage source signal at a high level, and turn on the switching circuit of only one mini-LED circuit of the circuit block having the voltage source signal at a high level;
   detect an output voltage and an output current of the backlight test circuit; and
   calculate an output impedance according to the output voltage and the output current of the backlight test circuit, wherein the mini-LED circuit is determined to be abnormal when the output impedance is beyond a predetermined impedance range.

3. The backlight module according to claim 2, wherein when N≥2, for the mini-LED circuits of any one circuit block, control signal input ends of the switching circuits are not connected with each other, but for any one mini-LED circuit of any one circuit block, the control signal input end of the switching circuit is connected to the control signal input end of the switching circuit of any one mini-LED circuit of another circuit block.

4. The backlight module according to claim 3, wherein the switching circuit is a depletion mode TFT, the source of the depletion mode TFT is connected to a voltage source, the gate of the depletion mode TFT receives the control signal, the drain of the depletion mode TFT is connected to an input end of the mini-LED set, and an output end of the mini-LED circuit is grounded.

5. The backlight module according to claim 2, wherein the switching circuit is a depletion mode TFT, the source of the depletion mode TFT is connected to a voltage source, the gate of the depletion mode TFT receives the control signal, the drain of the depletion mode TFT is connected to an input end of the mini-LED set, and an output end of the mini-LED circuit is grounded.

* * * * *